United States Patent [19]

Hays

[11] Patent Number: 4,626,448
[45] Date of Patent: Dec. 2, 1986

[54] PLASMA DEPOSITION OF AMORPHOUS METAL ALLOYS

[75] Inventor: Auda K. Hays, Albuquerque, N. Mex.

[73] Assignee: The United States of America as represented by the United States Department of Energy, Washington, D.C.

[21] Appl. No.: 756,126

[22] Filed: Jul. 18, 1985

[51] Int. Cl.$^4$ ............................................... B05D 3/06
[52] U.S. Cl. ................. 427/39; 204/164.165
[58] Field of Search ................. 427/39; 204/164.165

[56] References Cited

U.S. PATENT DOCUMENTS

| | | | |
|---|---|---|---|
| 3,677,799 | 11/1970 | Hou | 204/164 X |
| 3,900,585 | 8/1975 | Matsubara | 427/13 |
| 3,904,366 | 9/1975 | Grasenick | 204/164 X |
| 3,907,616 | 9/1975 | Wiemer | 148/188 |
| 3,968,270 | 7/1976 | Hasegawa | 427/13 |
| 4,099,969 | 7/1978 | Leder | 204/164 X |
| 4,262,631 | 4/1981 | Kubacki | 118/723 |
| 4,321,126 | 3/1982 | Kieferle et al. | 204/298 |
| 4,394,400 | 7/1983 | Green et al. | 427/38 |
| 4,400,410 | 8/1983 | Green et al. | 427/39 |
| 4,406,765 | 9/1983 | Higashi et al. | 204/164 |

OTHER PUBLICATIONS

Lieberman, H. H., "Amorphous Alloy Sample Preparation-Methods and Process Characterization," General Electric Report #82CRD146, May 1982.
Lieberman et al., "Rapid Solidification of Metastable Material," G.E. Report #81CRD327, Jan. 1982.
Wroge, D. M. et al., "Plasma Enhanced Deposition of Iron/Iron Oxide Films," Report 1979, LBL 9879.

Primary Examiner—Bernard D. Pianalto
Attorney, Agent, or Firm—Armand McMillan; Albert Sopp; Judson R. Hightower

[57] ABSTRACT

Amorphous metal alloy coatings are plasma-deposited by dissociation of vapors of organometallic compounds and metalloid hydrides in the presence of a reducing gas, using a glow discharge. Tetracarbonylnickel, phosphine, and hydrogen constitute a typical reaction mixture of the invention, yielding a NiPC alloy.

6 Claims, 1 Drawing Figure

PLASMA DEPOSITION OF AMORPHOUS METAL ALLOYS

BACKGROUND OF THE INVENTION

The U.S. Government has rights in this invention pursuant to Contract No. DE-AC04-76DP00789 between the U.S. Department of Energy and the AT&T Technologies, Inc.

This invention relates to amorphous metal alloy coatings. More particularly, it relates to a novel technique for producing a variety of amorphous metal alloy coatings on a variety of substrates of different sizes and shapes.

Three methods have conventionally been used to produce amorphous metal alloys of high strength, excellent corrosion and abrasion resistance, namely rapid solidification, sputtering and electroless chemical deposition.

The rapid solidification method is well described by H. H. Liebermann and J. L. Walters in "Rapid Solidification of Metastable Materials," General Electric Report No. 81CRD327 (January 1982), and by H. H. Liebermann in "Amorphous Alloy and Sample Preparation—Methods and Process Characterization," General Electric Report No. 82CRD146 (May 1982). Rapid solidification has been found practical for the production of ribbons and wires of amorphous metal alloys. However, the process requires relatively large expenditures of energy for melting the alloy to be coated and can only be carried out with substrates capable of withstanding the high temperatures involved with the liquid metal alloys used prior to the subsequent super-cooling. Adhesion of the splat-cooled coatings produced is also a problem.

For these reasons, coatings of amorphous metal alloys are generally produced by sputtering or electroless chemical deposition. The sputtering technique is briefly described in Liebermann's Report No. 82CRD146, along with other coating methods which include electron beam surface melting. The sputtering technique has limitations. One of them is the difficulty and expense involved in fabricating sputtering targets for multi-component metal alloys. Each target has to be uniquely formulated to take into account the diffusion time of the individual metal or metalloid atoms, as well as the sticking coefficients of these atoms to the surface to be coated. Small changes in alloy formulation to optimize a particular material property, e.g., corrosion resistance, require the fabrication of a new target. Another limitation, although not as severe, lies in coating of large, complex shapes uniformly. Sputtering is primarily a line-of-sight process and, as such, tends to have limited throwing power.

An electron beam evaporation process has been described by K. Matsubara (U.S. Pat. No. 3,900,585) for coating a solid metal onto a substrate. In that process, however, the substrate must serve as cathode and, therefore, must be conductive, and the resulting coatings are not amorphous. Iron also can be coated onto a substrate by a plasma-enhanced deposition method involving the decomposition of iron pentacarbonyl in a radio frequency power-induced glow discharge reactor, but again the resulting coating consists of iron crystallites embedded in an iron oxide matrix (D. M. Wroge and D. W. Hess, "Plasma-enhanced Deposition of Iron-/Iron Oxide Films," Report LBL-9879, 1979).

In view of the prior art and its limitations, it is an object of this invention to provide a novel technique to produce amorphous metal alloy coatings. Another object is to provide a technique that does not require large quantities of energy to produce such coatings. A further object is to develop a technique for application of amorphous metal alloy coatings that does not require heating the substrate above room temperature.

Still another object is to produce adherent amorphous metal alloy coatings. A further object is to provide a technique which can be easily and inexpensively varied to apply multi-component amorphous metal alloy coatings. A further object of this invention is to provide a technique which additionally can be used to coat large, irregularly-shaped objects in a uniform manner with amorphous metal alloy coatings.

Additional objects, advantages, and novel features of the invention will be set forth in part in the description which follows, and in part will become apparent to those skilled in the art upon examination of the following or may be learned by practice of the invention. The objects and advantages of the invention may be realized and attained by means of the instrumentalities and combinations particularly pointed out in the appended claims.

SUMMARY OF THE INVENTION

In accordance with the invention, amorphous metal alloy coatings are plasma-deposited on substrates by dissociating organometallic compounds and metalloid hydride vapors in a reducing carrier gas, preferably hydrogen, in a glow discharge environment. The plasma in the glow discharge is characterized by an average electron energy of 1 to 10 eV and electron densities of $10^9$ to $10^{12}$ cm$^{-3}$. Energy to initiate and sustain the discharge may be supplied at frequencies ranging from 0 to $10^{10}$ Hz. This energy may be coupled into the discharge either inductively, capacitively, or directly.

One or more different organometallic compounds and metalloid hydrides may be used to form a given film, but in any case the concentration and supply of the gaseous hydride component provided to the reaction mixture must be maintained at such a level that the metalloid content of the final metal alloy coating ranges between about 20 and about 40 atomic percent in order for the alloy to be amorphous and yet possess metallic properties.

DETAILED DESCRIPTION OF THE INVENTION

Figure 1:
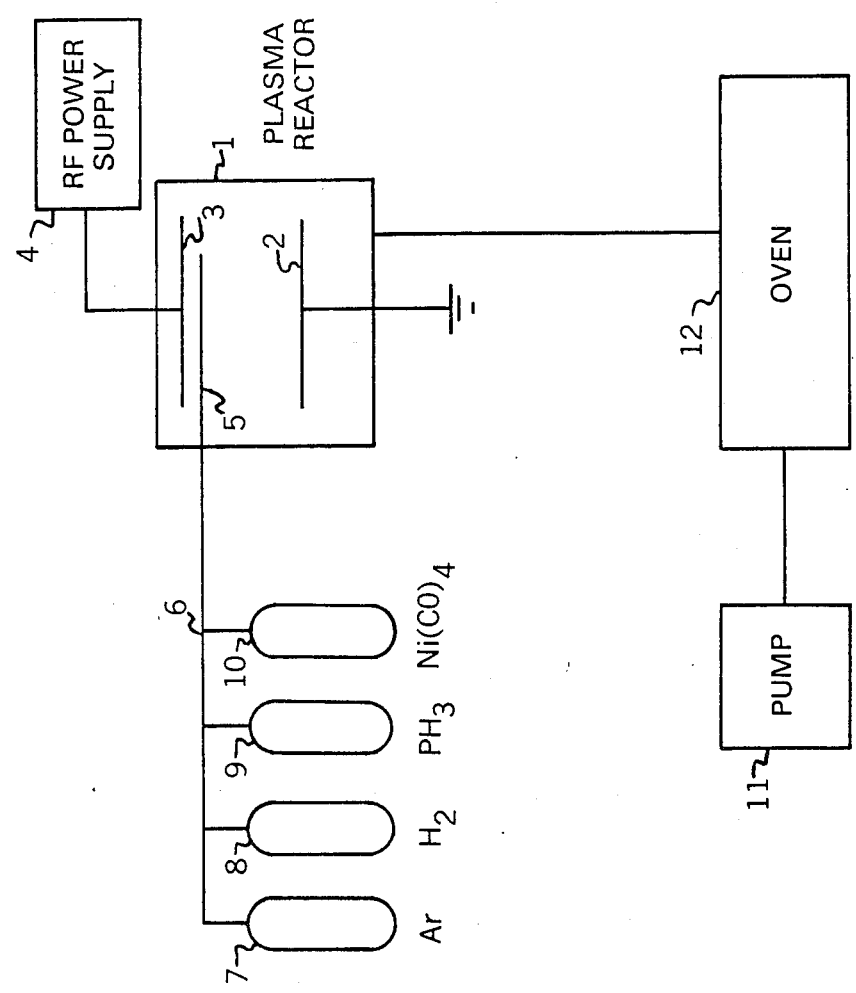
FIG. 1 shows, in schematic representation, a type of apparatus that can be used to carry out the technique of the invention.

The plasma deposition technique used to produce amorphous metal alloy coatings according to the invention consists of dissociating mixtures of organometallic compounds and metalloid hydrides in various carrier gases in the presence of a radio-frequency discharge.

Thus, the metal atoms in the final coating are provided by compounds such as metal carbonyls, metal alkyls, metal alkoxides, or metallocenes. Typical usable compounds within these classes include bis(cyclopentadienyl)magnesium, dibenzenechromium, dimethylcadmium, diethyltelluride, diethylzinc, pentacarbonyliron, tetracarbonylnickel, tricarbonylnitrosylcobalt, triisobutylaluminum, trimethylaluminum, trimethylantimony, trimethylarsenic, trimethylgallium, trimethylindium, tungsten hexafluoride, and the like. The metalloid atoms, on the other hand, are provided by their corresponding hydrides. A typical and preferred example of this type of gaseous compound is phosphine. Formation of an amorphous metal alloy coating also requires the presence of a reducing carrier gas, e.g., hydrogen, in order to avoid the incorporation of undesirable species in the film, e.g., metal oxides.

An apparatus that can be used to carry the process of the invention is shown in FIG. 1. As can be seen on the schematic diagram, plasma reactor 1 is equipped with grounded liquid-cooled electrode 2 (cooling means not shown) facing electrode 3 connected to radio-frequency power supply 4. Reaction and carrier gases are brought into reactor 1 through gas inlet 5 from manifold 6 and reservoirs 7, 8, 9 and 10 which, for illustrative purposes, are shown to contain argon, hydrogen, phosphine, and tetracarbonylnickel. Although four reservoirs are shown in the diagram, the manifold-reservoir arrangement can be altered to accomodate three or more gas or vapor sources.

Because of the toxicity of some of the gases employed in the process, oven 12 is provided downstream from the reactor and rough pump 11 is used to draw reflector effluent through said oven which is maintained at a temperature sufficient to dissociate any unreacted organometallic compound.

The coating process of the invention can be controlled by varying the plasma parameters: component and carrier gas pressures and flow rates, discharge current and power density, discharge frequency and discharge coupling mode. The final metal alloy coating composition can also be altered by changing component gas pressures and employing different components or mixtures of components.

The technique of the invention permits the deposition of amorphous metal alloy coatings which adhere very well to substrates, due in part to the plasma activation of the substrate surface during the coating process. Another interesting aspect of the process is that while electron temperatures in the plasma are high, ion temperatures are low, resulting in negligible substrate heating. This makes it possible to coat many types of materials that could not be handled by the conventional amorphous metal alloy coating processes. Another desirable feature of the present process is its ability to coat large, irregularly-shaped objects by using such objects, when possible, as the ground electrode in the plasma reactor.

The following examples will serve to illustrate the invention in greater operational detail and are not be construed as limitations of the invention beyond the scope of the appended claims. Other coating examples, which do not constitute embodiments of the invention, are also provided for comparative purposes.

Operating Procedure

An apparatus such as that described in FIG. 1 was used to produce coatings in the following manner.

Nickel carbonyl [$Ni(CO)_4$] and phosphine, for example, were admitted to the plasma reactor through metering valves. These gases were diluted with either hydrogen or argon, as particular preparations required. The argon, hydrogen, and phosphine used were obtained commercially and had stated purities of 99.995%, 99.999% and 99.999%, respectively. The nickel carbonyl was also obtained commercially and was received as a liquid stored under carbon monoxide. The carbon monoxide was removed by repeated freeze-pump-thawing of the nickel carbonyl cylinder. The room temperature vapor pressure of the nickel carbonyl was sufficient to provide the quantities required for the preparations.

Because of the extreme toxicity of nickel carbonyl, the entire preparation was carried out in a fume hood. The gaseous effluent from the reaction mixture was rough-pumped through an oven downstream of the plasma reactor, as explained in the drawing. The oven was maintained at 450° C., a temperature sufficient to dissociate any unreacted nickel carbonyl at the pressures and pumping speeds used. In addition, the room was equipped with a Thermo-Electron Corporation chemiluminescent nickel carbonyl analyzer for monitoring the presence of any carbonyl in the hood and at the outlet of the system's roughing pump.

A radio-frequency (13.56 MHz) electric field with a power density of 2 to 3 $W/cm^2$ was used to excite the glow discharge. This was capacitively coupled to the gas through aluminum electrodes 14 cm in diameter, mounted inside the glass reactor. The electrode spacing was 2.5 cm. The substrate to be coated was placed on the grounded, water-cooled electrode.

Because of the ease with which nickel carbonyl and phosphine were dissociated by the plasma, the gases had to be introduced directly in the glow region of the reactor. This was done through an insulated copper tube of 0.25 inch diameter. The gases were brought through the tube to the glow region at flow rates of 7.5, 0.75, and 32 sccm for the carbonyl, the phosphine, and hydrogen, respectively. Gas pressures were measured with a variable capacitance manometer. The total pressure in the chamber was typically 86.6 Pascals (0.65 Torr).

The plasma-deposited films obtained by this process were characterized using a variety of analytical techniques. Transmission electron micrographs (TEM) were taken to determine the degree of crystallinity present in the film. Specimens for these micrographs were prepared by plasma-depositing films on copper grids with holey carbon overlays. Infrared spectra were taken to determine the chemical functionality of species present in or absorbed on films plasma-deposited on KBr substrates. TEM and IR data were obtained on films with thicknesses of about 500 ångstroms.

Both electron microprobe analysis and inductively-coupled plasma spectroscopy were used to analyze the films. When these techniques were unable to account for 100 weight percent of the films in terms of, e.g., nickel and phosphorus, Auger electron spectroscopy (AES) was used to analyze the films for Ni, P, C, and O. These analyses were performed on films that were about one micrometer thick.

EXAMPLES 1 TO 4

Films of various thicknesses were plasma-deposited on substrates suitable for analytical characterization, such as KBr crystals, copper grids, and the like, using the technique just described and four different sets of conditions:

Example 1: $Ni(CO_4)$ at 0.120 Torr; $PH_3$ at 0.015 Torr; and Ar at 0.515 Torr; $Ni(CO_4)$ to $PH_3$ ratio, about 8:1

Example 2: same conditions as Example 1, but using $H_2$ instead of Ar

Example 3: $Ni(CO_4)$ at 0.120 Torr; $PH_3$ at 0.007 Torr; and $H_2$ at 0.523 Torr; $Ni(CO_4)$ to $PH_3$ ratio, about 17:1

Example 4: Ni(CO$_4$) at 0.120 Torr; H$_2$ at 530 Torr

As determined by TEM, the films deposited under the conditions listed for Examples 3 and 4 were crystalline in structure and, therefore, unsatisfactory.

As to the films plasma-deposited under the conditions in Examples 1 and 2, these were found to be amorphous. Films deposited under argon were reflective in the visible region of the spectrum but were black. On the other hand, films deposited with hydrogen as the carrier gas were silvery and, again, glassy.

Compositions and electron transport properties of the amorphous films of Examples 1 and 2 were measured and the results are summarized in the following table. These films are compared to the film deposited under the conditions of Example 4, with a reaction mixture containing no phosphine.

| | Plasma-Deposited Metal Alloy Films | | |
|---|---|---|---|
| | Ni(CO$_4$)/PH$_3$, 8:1 Argon carrier Example 1 | Ni(CO$_4$)/PH$_3$, 8:1 Hydrogen carrier Example 2 | Ni(CO$_4$) only Hydrogen carrier Example 4 |
| Composition: (atomic %) | | | |
| Ni | 68 | 64 | 86 |
| P | 13 | 25 | — |
| C | 13 | 10 | 10 |
| O | 4 | 1 | 4 |
| N | 2 | — | — |
| Resistivity: | | | |
| ($\mu$ohm-cm) | greater than 3 × 10$^5$ | approximately 300[a] | approximately 130[b] |
| Seebeck Coefficient: | | | |
| ($\mu$V/°C.) | +4.94 | +3.78 | −1.70 |
| Physical State: | Metallic glass | Metallic glass | Conventional crystalline metal alloy |

[a]Comparable to electroless Ni—P films with similar metallic content.
[b]Comparable to Ni—based superalloy.

It is interesting to note that although both Examples 1 and 2 films are amorphous, the absolute resistivity of films deposited with the use of argon is three orders of magnitude higher than that of films deposited in the presence of hydrogen.

The elemental analysis data in the table show phosphorus contents of 13 at% and 25 at% for the argon and the hydrogen preparations, respectively, for a net P enrichment factor of about 1.5 in the argon case and about 3 in the hydrogen case.

The preceding examples can be repeated with similar results by substituting the generically or specifically described reactants and/or operating conditions of this invention for those used in said examples. From the foregoing description, one skilled in the art can easily ascertain the essential characteristics of the invention and, without departing from the spirit and scope thereof, can make various changes and modifications to adapt it to various usages and conditions.

What is claimed is:

1. A method of plasma-depositing amorphous metal alloy coatings on a substrate, consisting of dissociating vapors of organometallic compounds and metalloid hydrides in a reducing gas in a glow discharge environment, wherein the ratio of the partial pressures of the organometallic and the hydride vapors is maintained at a level such that the metalloid content of the resulting coating is within the range of about 20 to 40 atomic percent, and wherein the plasma in the glow discharge is characterized by an average electron energy of 1 to 10 eV and electron densities of about 10$^9$ to 10$^{12}$ cm$^{-3}$, said energy being supplied at frequencies within the range of about 0 to 10$^{10}$ Hz.

2. The method of claim 1 wherein the energy is inductively, capacitively, or directly coupled to the plasma.

3. The method of claim 1 wherein the organometallic is selected from the group consisting of metal carbonyls, metal alkyls, metal alkoxides, and metallocenes.

4. The method of claim 1 wherein the reducing gas is hydrogen.

5. The method of claim 4 wherein the organometallic compound is tetracarbonylnickel and the hydride is phosphine.

6. The method of claim 5 wherein the ratio of partial pressures of organometallic vapors to hydride vapors is about 8:1 and the energy frequency is 13.56 MHz.

* * * * *